United States Patent [19]
Yokemura et al.

[11] Patent Number: 5,355,282
[45] Date of Patent: Oct. 11, 1994

[54] CONNECTOR STRUCTURE FOR MODULES IN ELECTRONIC APPARATUS

[75] Inventors: Hitoshi Yokemura; Masao Hosogai, both of Kawasaki; Yuko Tsujimura, Tokyo, all of Japan

[73] Assignee: Fujitsu Limited, Kanagawa, Japan

[21] Appl. No.: 39,242

[22] Filed: Apr. 26, 1993

[30] Foreign Application Priority Data

Aug. 30, 1991 [JP] Japan .................................. 3-219095

[51] Int. Cl.⁵ ............................................ H05K 7/02
[52] U.S. Cl. .................................... 361/760; 361/730; 361/736; 361/744; 361/785; 439/68; 439/44
[58] Field of Search ............... 361/715, 716, 720, 730, 361/735, 736, 744, 760, 785, 807; 439/68, 44, 74

[56] References Cited
FOREIGN PATENT DOCUMENTS 63-7665 2/1988 Japan .
B263-7665 2/1988 Japan .
63-37079 3/1988 Japan .
63-37079 3/1988 Japan .
3-241677 10/1991 Japan .

Primary Examiner—Leo P. Picard
Assistant Examiner—Young Whang
Attorney, Agent, or Firm—Armstrong, Westerman, Hattori, McLeland & Naughton

[57] ABSTRACT

An object of the present invention is to provide a connector structure for achieving a signal connection between modules not by way of a motherboard. In an electronic apparatus in which a plurality of modules (3, 4) are mounted on a motherboard (1) in an orderly manner, while flatly positioned parallel to the latter, and electrical connections between the modules and between the respective module and the motherboard are achieved by a connector body (2) extending along a boundary between the adjacent modules (3, 4), contacts (6, 7) are provided in the peripheral regions of the respective module (3, 4). Both the contacts (6, 7) are electrically connected with each other by pressing a connector spring (8) fixed in the connector body (2) onto the contacts (6, 7) provided in the peripheral regions of the adjacent modules (3. 4).

5 Claims, 8 Drawing Sheets

5,355,282

CONNECTOR STRUCTURE FOR MODULES IN ELECTRONIC APPARATUS

DESCRIPTION

1. Technical Field

The present invention relates to a novel connector structure for mounting a module on a motherboard so as to assemble an electronic apparatus such as a computer, a telephone switchboard or a communication apparatus, 2. Background Art Recently, in accordance with the miniaturization and speedup of an electronic apparatus, a flat mounting of modules has been developed, in which, as shown in FIG. 10, a plurality of modules (sub-printed circuit boards), each prepared by positioning and fixing circuit elements 71 on a board 70 and connecting the circuit elements with each other and with contacts 72 orderly arranged on the peripheral region of the board via lines 73, are flatly mounted on a common motherboard by connectors.

In such a mounting system, the signal connection between the respective modules is carried out, in many cases in the prior art, through signal lines in the motherboard, That is, as shown in FIG. 9, on modules 51, 52, contacts 53, 54 are provided at ends of signal lines 51, 52, respectively, and, on the motherboard 55, through-holes 56, 57, each corresponding to the contacts 53, 54 are provided while connected with each other by a conductor 58, A connector 61 having a pair of connector springs 59 exposed on the upper surface thereof and a pair of pins 60 projected from the lower surface thereof is fixedly mounted on the motherboard 55 while inserting the pins into the through-holes 56, 57. Then the modules 51, 52 are positioned on the motherboard 55 parallel thereto so that the contacts 53, 54 of the modules 51, 52 are in contact with the connector springs 59, Thereafter, pressure plates 62, 63 are forcibly applied onto the modules 51, 52 so that the contacts 53, 54 are reliably in contact with the connector springs 59. Thus a signal connection between the modules is achieved via a passage of contact 53—connector spring 59—through-hole 56—conductor 58—through-hole 57—connector spring 59—contact 54.

Even if many pairs of signal terminals exist between the modules, most of the connections between these terminals are achieved through the signal lines (corresponding to conductor 58) in the motherboard, as stated above. However, since the electric properties of the motherboard are generally not so good, the deterioration of transmitted signal quality and a signal interference are liable to occur when many signals use the signal lines on the motherboard.

It is an object of the present invention to solve such problems in the prior art and provide a connector structure for modules by which a signal can be directly transmitted between modules via the connector, not through a motherboard, if a higher signal transmission quality is required.

DISCLOSURE OF THE INVENTION

The above object is achieved, in an electronic apparatus in which a plurality of modules are orderly mounted on a motherboard, while flatly positioned parallel to the latter, and electrically connected with each other and with the motherboard by connector bodies each extending along a boundary between the adjacent modules, by a connector structure for connecting modules characterized in that a plurality of contacts are provided in the peripheral region of the respective module and a plurality of connector springs are provided in the connector body; the connector spring being in contact with a pair of said contacts each provided in the peripheral region of each the module confronting the other so that the electrical connection is achieved between both the contacts.

Since the contacts provided in the peripheral regions of the adjacent modules confronting each other are directly connected with the connector spring of the connector body, it is possible to directly achieve a signal transmission between the adjacent modules, without passing through the motherboard. Thereby it is possible to reduce the number of signal lines on the motherboard so that the generation of a signal interference can be restricted. In addition, since a signal connection between the modules can be achieved at a minimum distance, the deterioration of signal quality can be reduced.

BRIEF DESCRIPTION OF THE DRAWINGS

The present invention will be described in more detail below with reference to the preferred embodiments illustrated in the drawings; wherein.

BEST MODE FOR CARRYING OUT THE INVENTION

Figure 1:
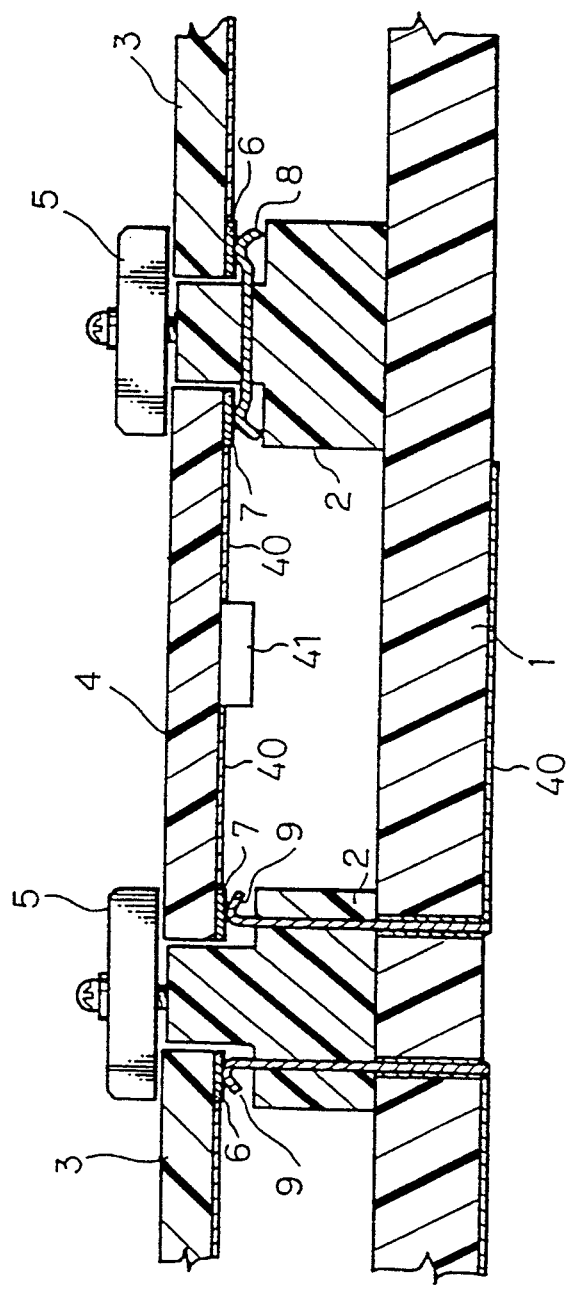
FIG. 1 is a side sectional view illustrating a principle of a connector structure for modules according to the present invention.
Figure 2:
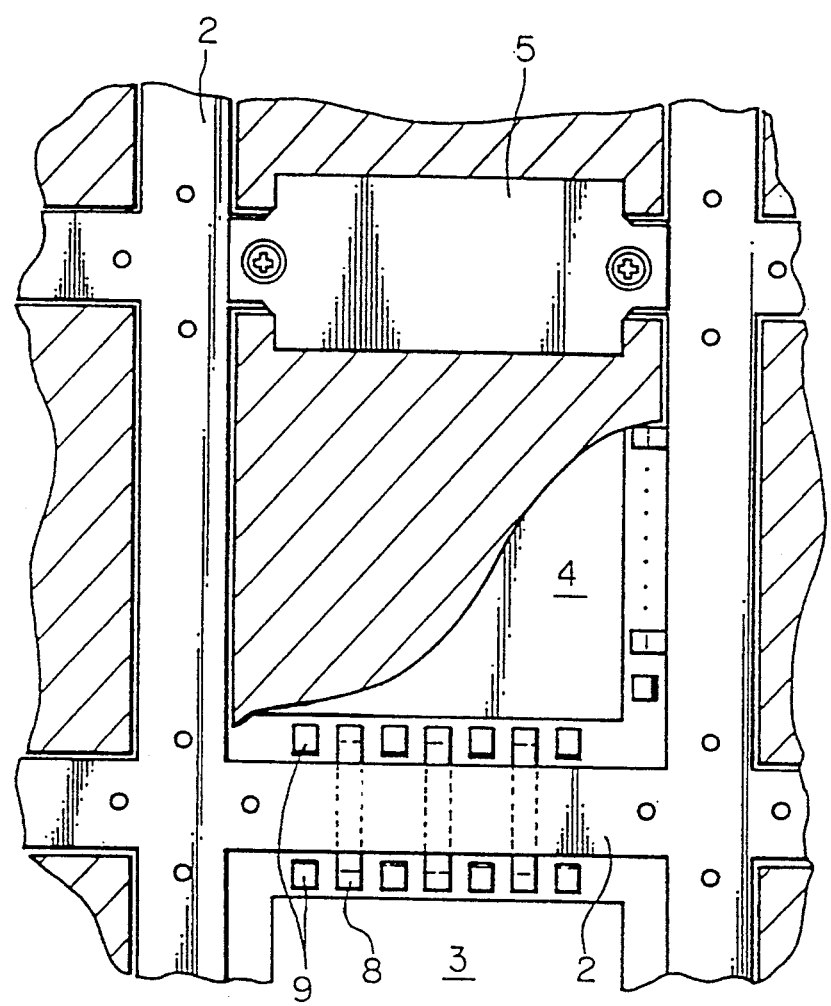
FIG. 2 is a partial broken plan view thereof.

FIGS. 1 and 2 are schematic views illustrating a principle of a connector structure for modules in an electronics apparatus according to the present invention.

A connector body 2 is provided in a grid-like shape on a motherboard 1. A plurality of modules 3, 4 are orderly arranged parallel to the motherboard 1 within the respective sections partitioned by the connector body and fixed by presser plates 5 secured on the connector body 2 by screws.

A plurality of pairs of contacts 6, 7 are arranged in rows on the lower surfaces of the peripheral regions of the adjacent modules 3, 4 confronting each other.

As illustrated on the right side of FIG. 2, connector springs 8 for connecting the modules are fixed while horizontally penetrating the connector body 2 and are in contact with the contacts 6, 7 of the modules 3, 4 by ends thereof laterally protruded on both sides so that both the contacts are directly electrically connected with each other. In this regard, the respective contacts 6, 7 are connected to a circuit element 41 through a wiring pattern 40.

On the other hand, as shown on the left side of FIG. 1, a pair of connector springs 9 are also fixed on the connector body 2 for connecting with the motherboard while vertically penetrating the same. The respective connector spring 9 is in contact with a wiring pattern 40 on the motherboard 1 by one end thereof and with the contact 6 or 7 of the module by the other end thereof so that the contacts 6, 7 are electrically connected with the signal line of the motherboard. This is a system suitably used when no problem occurs even though the signal transmission quality may deteriorate, as is the case of electric source, or when the direct connection is required between the contact on the module and the motherboard.

In FIG. 2, it is seen that the abovesaid connector spring 8 for connecting the modules with each other and the connector spring 9 for connecting the module with the motherboard are alternately arranged in the connector body 2, on which a common presser plate 5 is applied so that the connector springs are completely in contact with the contacts.

Figure 3:
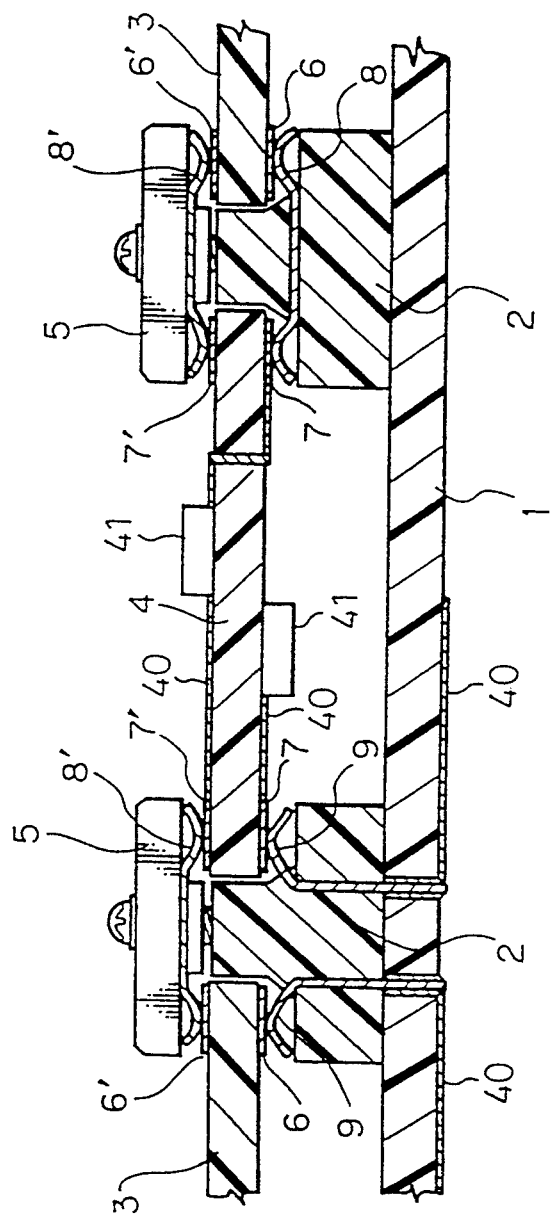
FIG. 3 is a side sectional view of a first embodiment of the present invention.

FIG. 3 illustrates a first embodiment further developed from the above principle, in which, in addition to the contacts 6, 7 on the lower surface of the peripheral region of the respective module 3, 4, other contacts 6', 7' are provided on the upper surface of thereof. As shown on the right side of FIG. 3, the contacts 6, 7 are directly connected with each other by a connector spring 8 fixed with a connector body 2 while horizontally penetrating the same, and the contacts 6', 7' are directly connected with each other by another connector spring 8' fixed with a presser plate 5 while horizontally penetrating the same.

In a system shown on the left side of FIG. 3, contacts 6', 7' provided on the upper surface of the modules 3, 4 are directly connected with each other by a connector spring 8' fixed on the lower surface of a presser plate 5. On the other, contacts 6, 7 provided on the lower surface of the modules are connected with a wiring pattern 40 on the motherboard 1 through connector springs 9 fixed with a connector body 2 while vertically penetrating the same, because the pattern 40 is used such as for supplying an electric source, in which no problem occurs even though the signal transmission quality deteriorates.

Figure 4:
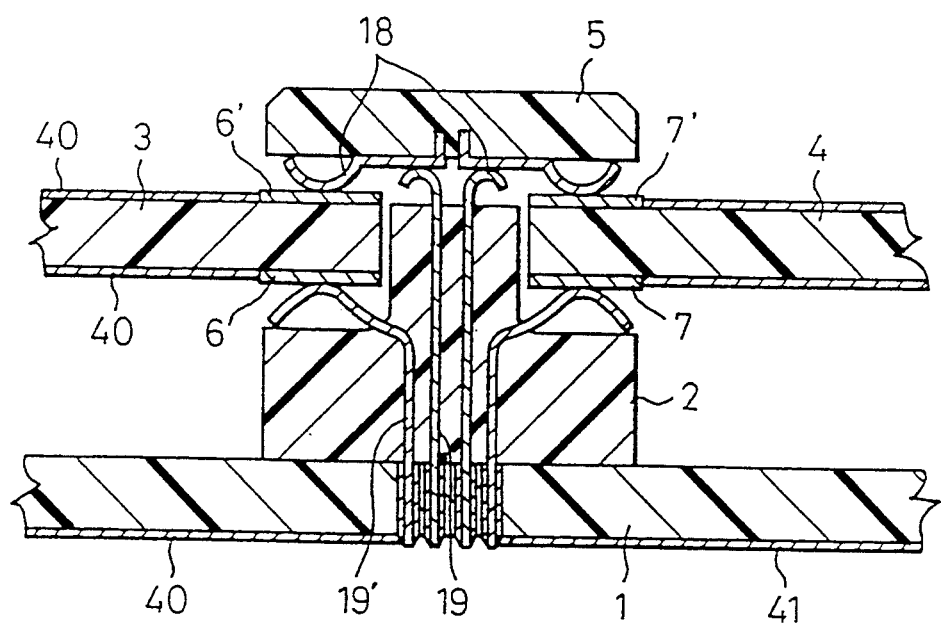
FIG. 4 is a side sectional view of a second embodiment of the present invention.

FIG. 4 illustrates a second embodiment for connecting contacts 6, 7 and 6', 7' provided on the upper surface and lower surface of modules, respectively, with a motherboard.

A pair of connector springs 19 are fixed with a central portion of a connector body 2 while vertically penetrating the same, as seen in a cross-section, for connecting the modules with the motherboard and connected at the ends thereof with the contacts 6', 7' provided on the upper surface of the modules through a pair of connector springs 18 fixed to the lower surface of a presser plate 5. Another pair of connector springs 19' are arranged outside of the connector springs 19 and fixed to the connector body 2 while vertically penetrating the same, so that the tip ends of the connector springs 19' are in contact with contacts 6, 7 provided on the lower surface of the modules.

Figure 5:
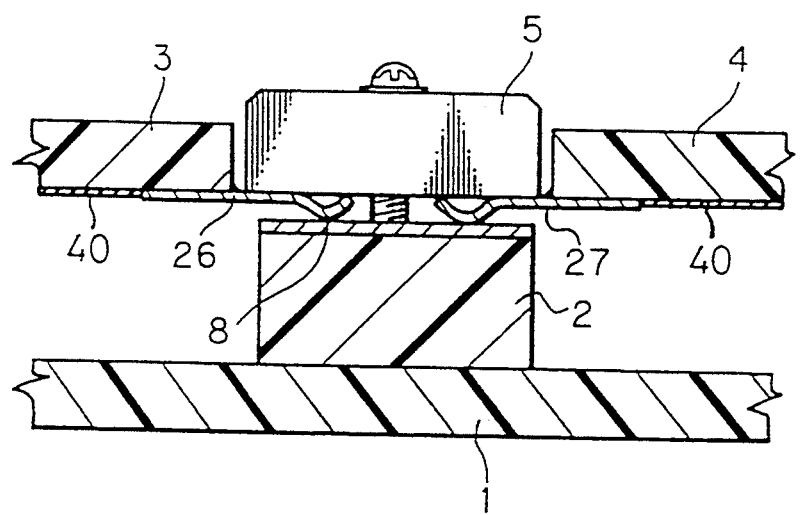
FIG. 5 is a side sectional view of a third embodiment of the present invention.

According to the embodiments shown in FIGS. 1 and 2, the contacts 6, 7 of the modules are provided within a peripheral region of the module, not exceeding the edge thereof. On the contrary, in a third embodiment shown in FIG. 5, these contacts are replaced by springy metal strips 26, 27 extending to the outside of the modules. Both the contacts 26, 27 are directly connected with each other through a terminal 8 fixed on the connector body 2. Accordingly, the connector body 2 can be of more simple structure.

Figure 6:
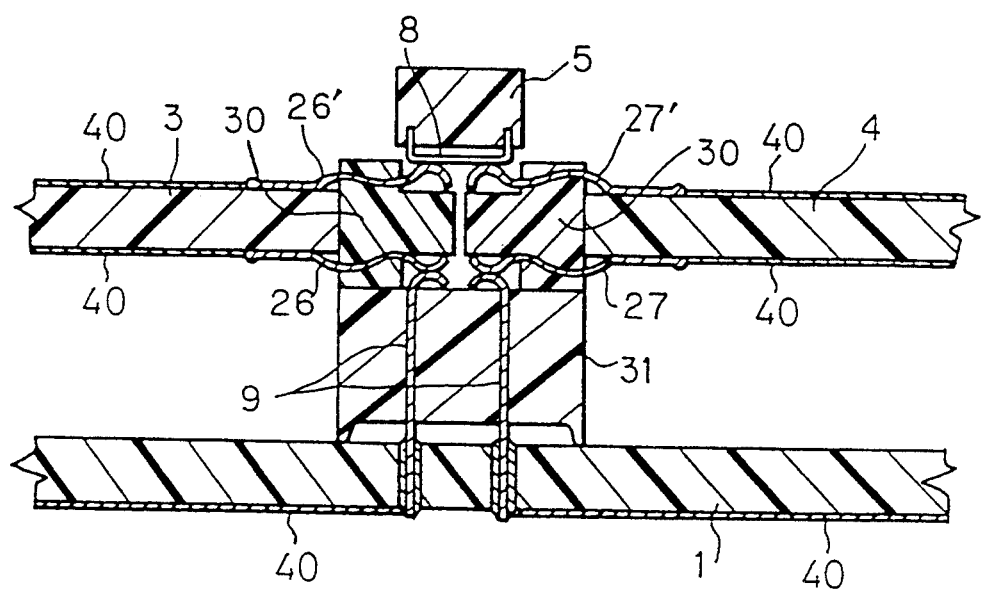
FIG. 6 is a side sectional view of a fourth embodiment of the present invention.
Figure 7:
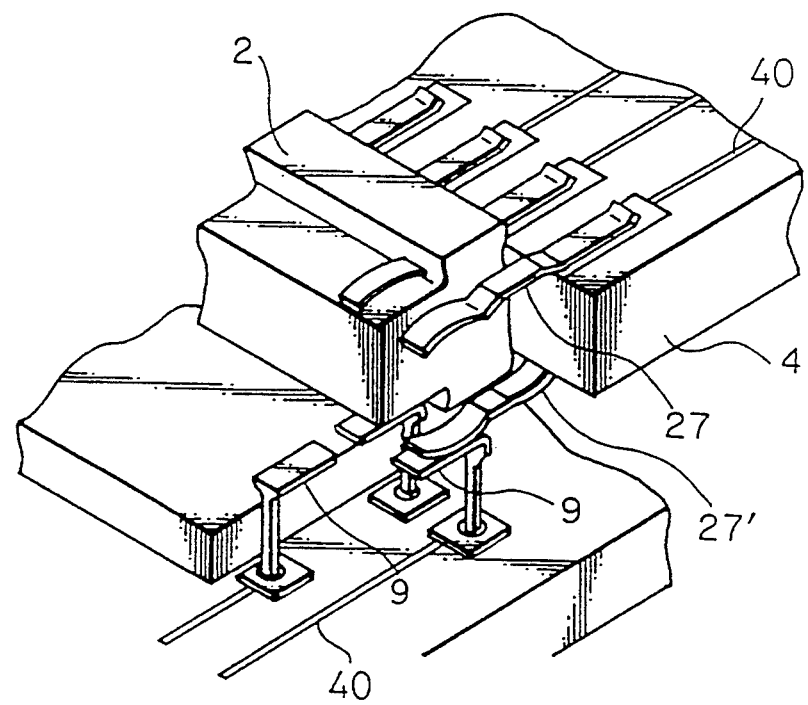
FIG. 7 is a partial broken perspective view thereof.

FIGS. 6 and 7 illustrate a fourth embodiment developed from the third embodiment. The connector body 2 is formed of an upper block 30 in which springy terminal strips 26, 27 and 26', 27' are preliminarily insert-molded and insulated from each other and a lower block 31 in which a pair of springy signal terminal strips 9 for the connection of a motherboard are preliminarily insert-molded in a vertical position, which blocks are layered together. The terminal strips 26', 27' are fixed at one end thereof on the peripheral regions of upper and lower surfaces of the modules 3, 4 by soldering. The terminal strips 26', 27' fixed on the upper surfaces are in contact with a module connecting common conductor 8 fixed on a lower surface of a presser plate 5 so that the direct electric contact between the terminal strips is achieved. On the other hand, the terminal strips 26, 27 fixed on the lower surfaces are in contact with the ends of the motherboard connecting springy terminal strips 9 projected above the lower block 31 so that the respective terminal strips are electrically connected with wiring patterns in the motherboard 1.

Figure 8:
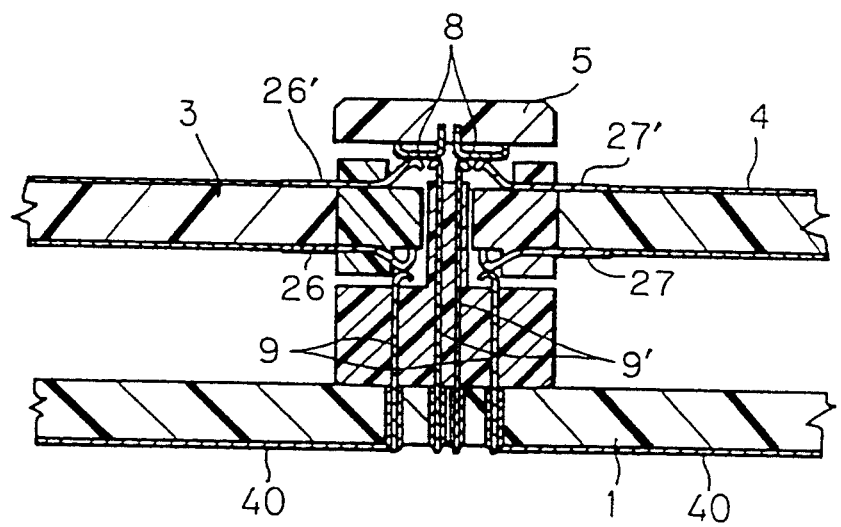
FIG. 8 is a side sectional view of a fifth embodiment of the present invention.
Figure 9:
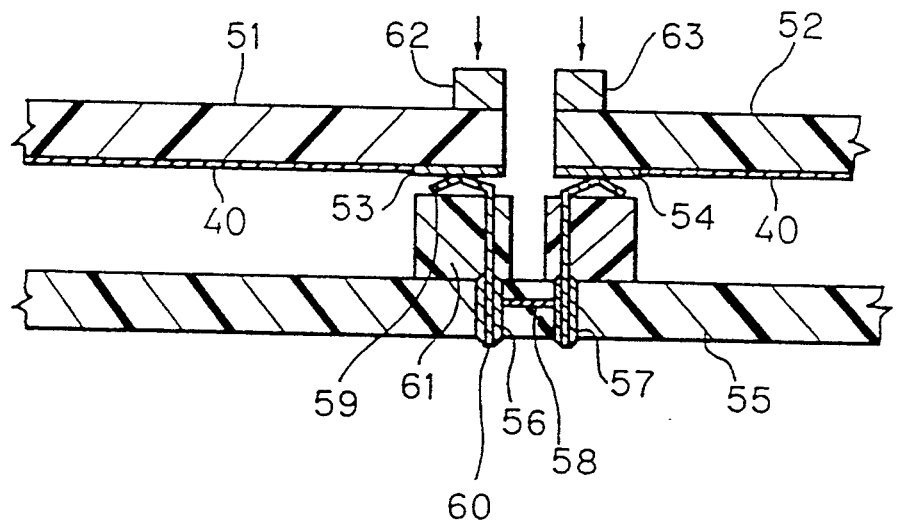
FIG. 9 is a side sectional view illustrating one conventional connector structure for modules.
Figure 10:
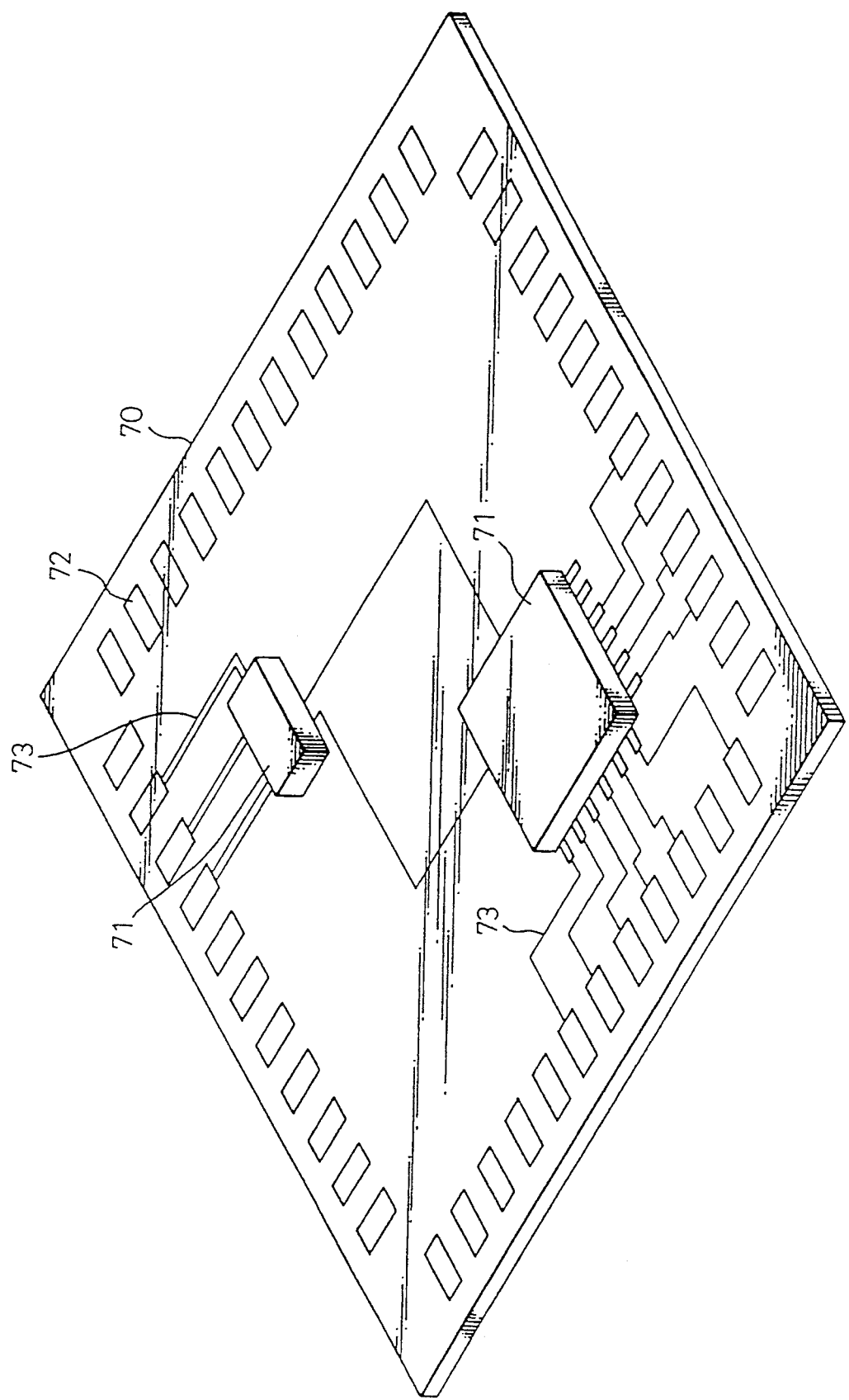
FIG. 10 is a perspective view of a structure of module.

FIG. 8 is a modification of the fourth embodiment, in which the module connecting connector spring 8 fixed on the lower surface of the presser plate 5 is divided into two parts, with which separate motherboard connecting springy terminal strips 9' are in contact. Thereby a signal connection between springy terminal strips 26', 27' and wiring patterns in the motherboard 1 is possible.

Also springy terminal strips 26, 27 are fixed on the lower surfaces of modules 3, 4 and connected with wiring patterns in the motherboard 1 through springy terminal strips 9 vertically penetrating a lower block 3, similar to the third embodiment.

By suitably mixing structures of the above embodiments, various connections are possible, such as direct signal connection not by way of a motherboard, a signal connection between the respective surfaces of modules and a motherboard, or, if necessary, a connection between wiring patterns in a motherboard and terminals of the respective modules.

According to the present invention, as described in detail above, it is possible to achieve a direct signal connection between modules by a simple structure, not by way of a wiring pattern in a motherboard but through a connector, whereby the deterioration of signal quality and the generation of signal interference can be avoided, which are liable to occur when the signal connection is achieved through a motherboard.

CAPABILITY OF EXPLOITATION IN INDUSTRY

The present invention can be used for the manufacture of an electronic apparatus requiring compactness and high processing speed, such as a computer, a telephone switch board or a communication apparatus.

We claim:

1. An electronic apparatus, comprising a plurality of modules that (3, 4) are orderly mounted on a motherboard (1) while flatly positioned parallel to the latter and a plurality of pairs of contacts (6, 7) provided along the edge portions of the respective modules (3, 4), a connector structure including a connector body (2) which extends along a boundary between the adjacent modules, and a plurality of connector springs (8, 8')

integral with the connector body which are pressed onto and in contact with the respective pair of said contacts (6, 7) confronting each other and provided on the adjacent modules (3, 4) so that the electrical connection is achieved between the respective pair of said contacts (6, 7), and further including at least one other connector spring which is integral with the connector body and which is electrically connected between at least one of said modules and a wiring pattern of said motherboard.

2. The apparatus as defined by claim 1, wherein the contacts (6, 7; 6', 7') are provided on upper and lower surfaces of the modules and the connector springs (8, 8') are provided corresponding thereto.

3. The apparatus as defined by claim 1 or 2, wherein the connector spring (18) is divided into two parts, each of which is in contact with the contact of the module adjacent thereto.

4. The apparatus as defined by claim 1, wherein the connector body (2) is located in between and separates the motherboard (1) and the modules (3, 4) with lower side edges of the modules extending over an upper surface of said connector body and a lower surface of the connector body extending over an upper surface of said motherboard, a pressor plate (5) is located on an opposite side of said modules than said motherboard and a tightening screw extends through said pressor plate into said connector body.

5. An electronic apparatus, comprising a plurality of modules that (3, 4) are orderly mounted on a motherboard (1) while flatly positioned parallel to a latter, a plurality of pairs of springy terminal strips (26, 27) provided on and extending outwardly from the edge portions of respective modules confronting each other, a connector structure including a connector body (2) which extends along a row of said terminal strips so that the pair of respective terminal strips in each said pair of terminal strips are connected together by pressing a conductor (8) of the connectory body (2) into contact with the respective terminal strips (26, 27), further including at least one connector spring which is integral with the connector body and which is electrically connected between at least one of said modules and a wiring pattern of said motherboard.

* * * * *